(12) United States Patent
Umemoto

(10) Patent No.: US 7,700,264 B2
(45) Date of Patent: Apr. 20, 2010

(54) PHOTOSENSITIVE RESIN COMPOSITION, IMAGE FORMING MATERIAL AND IMAGE FORMING METHOD USING THEREOF

(75) Inventor: Hirotoshi Umemoto, Osaka (JP)

(73) Assignee: Nippon Paint Co., Ltd., Osaka (JP)

( * ) Notice: Subject to any disclaimer, the term of this patent is extended or adjusted under 35 U.S.C. 154(b) by 580 days.

(21) Appl. No.: 11/589,891

(22) Filed: Oct. 31, 2006

(65) Prior Publication Data

US 2007/0099115 A1    May 3, 2007

(30) Foreign Application Priority Data

Oct. 31, 2005    (JP) ............................. 2005-316830

(51) Int. Cl.
G03F 7/029 (2006.01)
G03F 7/028 (2006.01)
G03F 7/30 (2006.01)

(52) U.S. Cl. ................. 430/284.1; 430/287.1; 430/300; 430/302; 430/273.1; 430/925; 430/944; 522/25; 101/456

(58) Field of Classification Search ........................ None
See application file for complete search history.

(56) References Cited

U.S. PATENT DOCUMENTS

| | | |
|---|---|---|
| 4,692,396 A | 9/1987 | Uchida |
| 5,185,234 A * | 2/1993 | Nakatsukasa et al. .... 430/284.1 |
| 5,393,637 A | 2/1995 | Kanda et al. |
| 6,291,133 B1 * | 9/2001 | Takagi et al. ............. 430/284.1 |

FOREIGN PATENT DOCUMENTS

| | | |
|---|---|---|
| EP | 0 828 195 | 2/2003 |
| JP | 48-18327 | 6/1973 |
| JP | 60-208748 | 10/1985 |
| JP | 60-214354 | 10/1985 |
| JP | 4-274428 | 9/1992 |
| JP | 5-36581 | 2/1993 |
| JP | 5-333542 | 12/1993 |
| JP | 7-261407 | 10/1995 |
| JP | 10-90886 | 4/1998 |
| JP | 10-97059 | 4/1998 |
| JP | 10-110008 | 4/1998 |
| JP | 10-198031 | 7/1998 |
| JP | 2000-187322 | 7/2000 |

OTHER PUBLICATIONS

English translation of JP, 2000-187322, A (2000) from machine translation from AIPN Japan Patent Office National center for Industrial Property Information and Training, generated Oct. 24, 2008, 37 pages.*

* cited by examiner

Primary Examiner—Cynthia Hamilton
(74) Attorney, Agent, or Firm—Wenderoth, Lind & Ponack, L.L.P.

(57) ABSTRACT

A photosensitive resin composition containing an alkali soluble resin, an ethylenically unsaturated compound, a near infrared absorbing dye, a compound containing a halomethyl group and a compound containing an organoboron anion, wherein the alkali soluble resin is an acryl resin having one or more pendant groups in which both terminals of a diol compound have been blocked with isophorone diisocyanates and then (meth)acryloyl has been added. Also provided is an image forming material having a substrate, and a photosensitive layer formed by the photosensitive resin composition on the substrate, as well as an image forming method.

13 Claims, No Drawings

PHOTOSENSITIVE RESIN COMPOSITION, IMAGE FORMING MATERIAL AND IMAGE FORMING METHOD USING THEREOF

TECHNICAL FIELD

The present invention relates to a photosensitive resin composition, specifically a photosensitive resin composition to be sensitized with active beam having wavelength of 800 to 860 nm and an image forming material and an image forming method using thereof.

BACKGROUND OF THE INVENTION

A method of directly drawing on a printing plate material with laser light based on the image data by a computer is studied for printing newspaper and the like. In particular, since semiconductor laser and solid laser having output power at infrared area have characteristics in stability, cost, output power and compactness, the development of a photosensitive resin composition having photosensitive properties at a wavelength area suitable for such laser (in particular, a negative-type photosensitive resin composition in which an irradiated portion is cured) has been desired.

Such photosensitive resin composition used for negative-type printing plate material contains generally an alkali soluble resin, an infrared absorbing dye, a polymerization initiator and a compound containing an ethylenically unsaturated double bond. When light is irradiated, the composition forms a cured portion by polymerization of the compound having an ethylenically unsaturated double bond. The portion where light is not irradiated is removed by development based on its alkali soluble nature. Performances such as durability and adherence are generally required for the composition. In order to introduce the durability, it is considered to introduce double bonds to the side chains of alkali soluble resins (see JP-A-2000-187322).

SUMMARY OF THE INVENTION

In JP-A-2000-187322, the introduction of double bonds to the side chains of an alkali soluble resin is carried out by adding an epoxy compound containing an unsaturated group to the carboxyl group of the alkali soluble resin. The introduced unsaturated group is nearly apart from the resin skeleton of the alkali soluble resin and it cannot adequately contribute to crosslinking reaction by the factors such as steric hindrance according to the method; therefore the level of imparting the durability was inadequate.

The present inventor has devised a novel acryl resin in which an unsaturated group introduced in an alkali soluble resin is placed at a longer distance from the resin skeleton of the alkali soluble resin, the mobility of the unsaturated group is promoted and the number of the unsaturated double bonds is increased; therefore it allows crosslinking reaction to occur easily and a functional resin portion which imparts specific function, in particular, function of suppressing polymerization inhibition due to oxygen by introduction of an active methylene group is provided at a resin portion existing between the acryl resin skeleton and the unsaturated double bond, and the present inventor has completed the photosensitive resin composition containing such acryl resin.

The present invention provides a photosensitive resin composition comprising an alkali soluble resin, an ethylenically unsaturated compound, a near infrared absorbing dye, a compound containing a halomethyl group and a compound containing an organoboron anion, wherein the alkali soluble resin comprises an acryl resin having one or more of pendant groups in which both terminals of a diol compound have been blocked with isophorone diisocyanates and then (meth)acryloyl has been added.

The above-mentioned alkali soluble resin preferably contains, at least partially, an alkali soluble resin in which one or more of pendant groups represented by the formula:

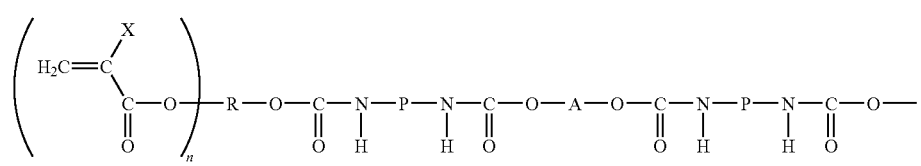

(1)

wherein X is the same or different and represents hydrogen or a methyl group, n represents an integer of 1 to 3, R represents an alkylene chain which may have a substituent, P is a group represented by the formula:

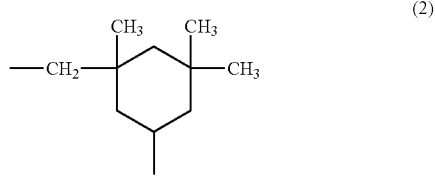

(2)

and A represents a diol residue in which OH groups have been removed from a diol compound, are incorporated in an acryl resin having a resin hydroxyl group value of 5 to 100 mgKOH/g and a resin acid value of 30 to 250 mgKOH/g.

Preferably, the ethylenically unsaturated compound has 2 to 15 of (meth)acryl groups and molecular weight of 300 to 3000, and the content of the ethylenically unsaturated compound is 30 to 90% by weight.

Further, the near infrared absorbing dye can be a cyanine dye and/or a polymethine dye.

Further, the near infrared absorbing dye can be a die having the maximum absorbing wavelength at 800 to 860 nm.

The content of the near infrared absorbing dye can be 0.05 to 20 parts by weight based on 100 parts by weight of the total amount of the ethylenically unsaturated compound and the alkali soluble resin.

The content of the compound containing a halomethyl group is preferably 0.1 to 20 parts by weight based on 100 parts by weight of the total amount of the ethylenically unsaturated compound and the alkali soluble resin.

Further, the content of the compound containing an organoboron anion can be 0.1 to 20 parts by weight based on 100 parts by weight of the total amount of the ethylenically unsaturated compound and the alkali soluble resin.

Further, the weight ratio of the near infrared absorbing dye, the compound containing a halomethyl group and the compound containing an organoboron anion can be 0.1 to 10 for the compound containing a halomethyl group and 0.1 to 10 for the compound containing an organoboron anion when the weight of the near infrared absorbing dye is referred to as 1.

Further, an image forming material (e.g. printing plate) comprising a substrate, and a photosensitive layer formed by the photosensitive resin composition on the substrate is also provided.

An image forming method comprising exposing the photosensitive layer of the image forming material with infrared laser having wavelength of 780 to 1200 nm, and development processing with alkali developer is also provided.

Further, a printing plate obtainable or obtained by the image forming method is also provided.

In the present invention, using a hydroxyl group and a carboxyl group existing in the basic acryl resin skeleton, a compound having 1 to 3 of unsaturated double bonds is coupled with them via a polymer diol which is called as a functional material. The coupling provides at least 1 to 3 of unsaturated double bonds to one pendant group, the resulting multi-functionalization improves curability and which improves printing durability. Further, the functional material, which is to be inserted between the acryl resin skeleton and the unsaturated double bonds, can impart wettability to a substrate, the mobility of a polymerizable functional group and the function of suppressing polymerization inhibition due to oxygen by an active methylene group. Further, both terminals of the diol compound have been blocked by isophorone diisocyanates. The blocking with the isophorone diisocyanates improves the aggregation property of the acryl resin and which improves adhesiveness with a substrate.

DETAILED DESCRIPTION OF THE PREFERRED EMBODIMENTS

The present invention is specifically described as follows.

Alkali Soluble Resin

The alkali soluble resin employed in the present invention contains an acryl resin having one or more of pendant groups in which both terminals of a diol compound have been blocked with isophorone diisocyanates and then (meth)acryloyl has been added or attached thereto. The diol compound corresponds to the above-mentioned functional material which is to be inserted between the acryl resin skeleton and the unsaturated double bond (specifically, a (meth)acryloyl group). Further, the blocking with isophorone diisocyanates improves aggregation property and which contributes to the improvement of adhesiveness. Further, the addition of one or more, preferably two or more of (meth)acryloyl groups improves curing property and also improves printing durability. In the present invention, since the unsaturated double bond(s) exists at a separate distance from the resin skeleton, degree of freedom is high to improve reactivity and it causes the improvement of the curing property.

The specific alkali soluble resin comprises, more specifically, at least partially, an alkali soluble resin in which one or more of pendant groups represented by the formula:

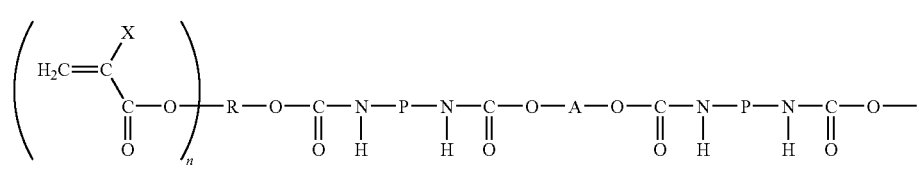

wherein X is the same or different and represents hydrogen or a methyl group, n represents an integer of 1 to 3, R represents an alkylene chain which may have a substituent, P is a group represented by the formula:

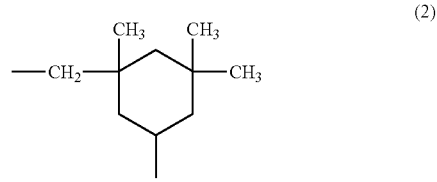

and A represents a diol residue in which OH groups have been removed from a diol compound, are incorporated in an acryl resin having a resin hydroxyl group value of 5 to 100 mgKOH/g and a resin acid value of 30 to 250 mgKOH/g.

The above-mentioned acryl resin has one or more of pendant groups represented by the formula (1):

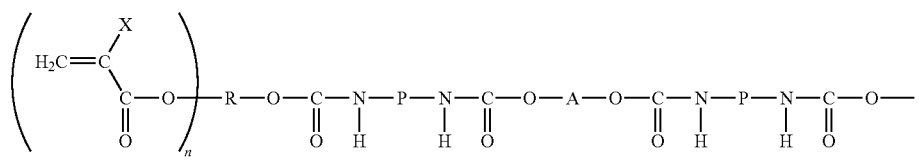

wherein X, n, R, A and P are as defined above respectively. The coupling end of the pendant group is attached to the acryl resin skeleton in a pendant like manner, but since this addition is via urethane bonding, the pendant group represented by the formula (1) is introduced by reaction with an acryl resin having hydroxyl groups and carboxyl groups. The pendant group represented by the chemical formula (1) is formed by reacting a diol compound (e.g., polymer diol as a functional material) represented by the formula (3):

wherein A is as defined above, with isophorone diisocyanates, to form isocyanate groups at both terminals, and then blocking one end with (poly)acrylate monoalcohol to obtain a half-blocked isocyanate compound represented by the formula (4):

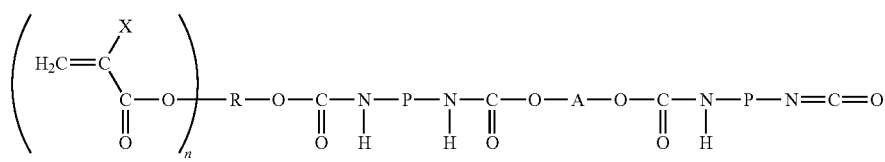

wherein X, n, R, P and A is as defined above respectively, and then, which is reacted with an acryl resin having hydroxyl groups and carboxyl groups.

The diol compound of the formula (3) is considered to be the functional material in the present invention and selected from a group consisting of polyalkylene glycols, alkane diols, tricaprolactone diols, polycarbonate diols and polyester diols. Specifically preferable functional diol includes triethylene glycol, polycarbonate diols (e.g., PCDX-02 manufactured by Asahi Kasei Chemicals Corporation) and the condensate of dibasic acid and its anhydride with bifunctional alcohol (more preferably, the condensation diol of tetrahydrophthalic anhydride with 1,6-hexane diol, but other dibasic acid includes methyltetrahydrophthalic anhydride, hymic anhydride, methylcyclohexanetricarboxylic, anhydride and the like and/or other bifunctional alcohol includes ethylene glycol, propylene glycol, 1,3-butylene glycol, 1,4-butylene glycol, 1,5-pentylene diol, diethylene glycol, dipropylene glycol, triethylene glycol, neopentyl glycol, hydrogenated bisphenol-A and the like).

The functional diol is reacted with isophorone diisocyanates and the isophorone diisocyanate is illustrated by the following chemical formula:

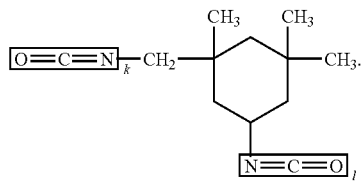

As cleared from the formula, the isocyanate groups (—N=C=O) have different reactivity depending on the steric environment of the bonding sites. The (k) portion of the above chemical formula has higher reactivity. Accordingly, when isophorone diisocyanate reacts with the above diol compound (3), the isocyanate group having higher reactivity is predominantly reacted with the hydroxyl group in the diol compound.

Since the hydroxyl groups at both terminals react with isophorone diisocyanate, the reaction requires an amount of 2 mol or more of isophorone diisocyanate per one mole of the diol compound to be carried out. The reaction conditions are adequate to keep temperature at 80° C. for one hour when tin catalyst is used.

The resulting compound has the chemical formula (6):

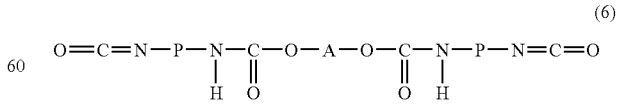

wherein A and P are as defined above respectively.

Then, the resulting diisocyanate compound represented by the formula (6) is reacted with (poly)acrylate monoalcohol represented by the formula (5):

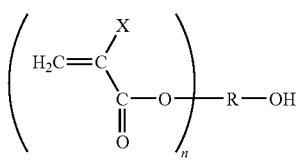

(5)

wherein X, n and R are as defined above respectively, in which reaction one isocyanate group is consumed to give a half-blocked isocyanate compound represented by the following formula (4). The reaction conditions are adequate to keep temperature at 80° C. for one hour when tin catalyst is used.

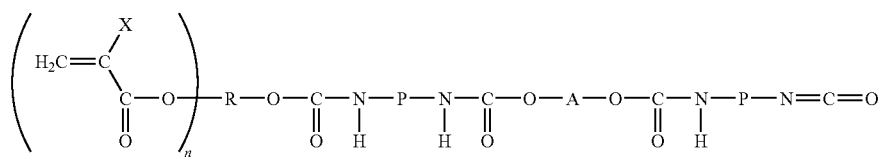

(4)

wherein X, n, R, P and A are as defined above respectively.

The (poly)acrylate monoalcohol which is employed in the present invention has one or more (preferably, 1 to 3) of acrylate groups as shown in the formula (5) and at least one hydroxyl group. Further, the term "(poly)" as used herein is inclusive poly- and not poly-, specifically, mono-, di-, tri- and the like. The example of the compound includes various compounds such as 2-hydroxy-3-phenoxypropyl acrylate, 2-hydroxyethyl methacrylate, 2-hydroxypropyl methacrylate, 2-hydroxyethyl acrylate, 2-hydroxypropyl acrylate, 2-hydroxybutyl methacrylate and 2-acryloyloxyethyl-2-hydroxyethyl phthalate in case of n=1; glycerin dimethacrylate and 2-hydroxy-3-acryloyloxypropyl methacrylate in case of n=2; and pentaerythrytol polyacrylate in case of n=3. Among these compounds, pentaerythrytol triacrylate (A-TMM-3L (n=3) manufactured by Shin-Nakamura Chemical Co., Ltd.) and 2-hydroxy-3-acryloyloxypropyl methacrylate (LIGHT ESTER G-201P (n=2) manufactured by KYOEISHA CHEMICAL Co., Ltd.) are preferable. In particular, pentaerythrytol triacrylate is preferable because polymerizable double bond is trifunctional.

The resulting half-blocked isocyanate compound (6) reacts with an acryl resin having hydroxyl groups and carboxyl groups to form a pendant of the acryl resin. The acryl resin having hydroxyl groups and carboxyl groups is generally obtained by copolymerizing a monomer having a hydroxyl group with a monomer having a carboxyl group, or obtained by copolymerizing a monomer having a hydroxyl group with a monomer having acid anhydride group, and then subjecting to hydrolysis or half-esterification of the acid anhydride portion, etc.

The monomer having a hydroxyl group includes hydroxymethyl (meth)acrylate, 2-hydroxyethyl (meth)acrylate, hydroxypropyl (meth)acrylate, 4-hydroxybutyl (meth)acrylate, the adduct of ε-caprolactone monomer therewith, and the like.

The monomer having a carboxyl group includes (meth)acrylic acid, 2-acrylsuccinoloyloxyethyl methacrylate, 2-maleinoloyloxyethyl methacrylate, 2-phthaloyloxyethyl methacrylate, 2-hexahydrophthaloyloxymethyl methacrylate, maleic acid, fumaric acid, itaconic acid, crotonic acid and the like. The monomer having a hydroxyl group may be copolymerized with the monomer having a carboxyl group, but in general, they may also be copolymerized with other unsaturated monomer.

The example of the copolymerizable monomer includes styrene, α-methylstyrene, methyl (meth)acrylate, ethyl (meth)acrylate, propyl (meth)acrylate, isopropyl (meth)acrylate, butyl (meth)acrylate, vinyl acetate, acrylonitrile, (meth)acrylamide, glycidyl (meth)acrylate, allyl glycidyl ether, glycidyl methyl acrylate, crotonic acid glycidyl ether, (meth)acrylic chloride, benzyl (meth)acrylate, N-methylol acrylamide, N-dimethylamide, N-methacryloyl morpholine, N,N-dimethylaminoethyl (meth)acrylate, N,N-dimethylaminoethyl acrylamide and the like.

Further, it includes also a resin obtained by copolymerizing maleic acid with styrene, α-methylstyrene or the like, and then half-esterifying the portion of maleic anhydride unit with monovalent alcohol such as methanol, propanol and butanol or hydrolyzing the portion with water.

The acryl resin employed in the present invention before a pendant group (T) is introduced is an acryl resin having a resin hydroxyl group value of 5 to 100 mgKOH/g and a resin acid value of 30 to 250 mgKOH/g.

The reaction of the acryl resin having hydroxyl groups and carboxyl groups with the half-blocked isocyanate compound (4) is carried out by reacting them at 80° C. in the presence of a tin catalyst in a similar manner as described above until the absorption peak of the isocyanate group at 2270 cm$^{-1}$ on infrared absorption spectrum is disappeared.

The alkali soluble resin may, at least partially, contain the above-mentioned acryl resin and other alkali soluble resin can be also used. Such alkali soluble resin is a resin having a carboxyl group. The resin having a carboxyl group includes 1) a resin obtained by the radical polymerization or ion polymerization of a monomer having a carboxyl group, 2) a resin obtained by radical-polymerizing or ion-polymerizing a monomer having acid anhydride group, and then hydrolyzing or half-esterifying the acid anhydride unit, 3) epoxy acrylate obtained by modifying an epoxy resin with unsaturated mono-carboxylic acid and/or acid anhydride, and the like.

As a specific example, a vinyl resin having a carboxyl group is mentioned. The vinyl resin includes a resin obtained by homopolymerizing unsaturated carboxylic acid such as (meth)acrylic acid, 2-succinoloyloxyethyl methacrylate, 2-maleinoloyloxyethyl methacrylate, 2-phthaloyloxyethyl methacrylate, 2-hexahydrophthaloyloxyethyl methacrylate, maleic acid, fumaric acid, itaconic acid, crotonic acid and the like as a monomer having a carboxyl group; a resin obtained by copolymerizing the unsaturated carboxylic acid with vinyl monomer having no carboxyl group such as styrene, α-methylstyrene, methyl (meth)acrylate, ethyl (meth)acrylate, propyl (meth)acrylate, isopropyl (meth)acrylate, butyl (meth)acrylate, vinyl acetate, acrylonitrile, (meth)acrylamide, glycidyl (meth)acrylate, allyl glycidyl ether, glycidyl ethyl methacrylate, crotonic acid glycidyl ether, (meth)acrylic chloride, benzyl (meth)acrylate, hydroxyethyl (meth)acrylate, N-methylol acrylamide, N,N-dimethylacrylamide, N-methacryloyl morpholine, N,N-dimethylaminoethyl (meth)acrylate, N,N-dimethylaminoethyl acrylamide or the like.

Further, the vinyl resin may include also a resin obtained by copolymerizing maleic anhydride with styrene, α-methylstyrene or the like, and then half-esterifying the portion of maleic anhydride unit with monovalent alcohols such as methanol, ethanol, propanol, butanol and hydroxyethyl (meth)acrylate, or hydrolyzing with water.

Further, the vinyl resin may include also a resin obtained by adding a novolak epoxy acrylate resin, a bisphenol epoxy resin or the like with unsaturated carboxylic acid such as (meth)acrylic acid, 2-succinoloyloxyethyl methacrylate, 2-maleinoloyloxyethyl methacrylate, 2-phthaloyloxyethyl methacrylate, 2-hexahydrophthaloyloxyethyl methacrylate, maleic acid, fumaric acid, itaconic acid and crotonic acid, or with saturated carboxylic acid such as acetic acid, propionic acid and stearic acid, and then by modifying with an acid anhydride such as maleic anhydride, itaconic anhydride, tetrahydrophthalic anhydride and phthalic anhydride.

Among the above-mentioned resins, the resin having a carboxyl group, in particular, (meth)acrylic acid (co)polymerization resin containing (meth)acrylic acid is preferable from the aspect of development property. The specific example of these copolymer includes the methyl methacrylate/methacrylic acid copolymer disclosed in JP-A-60-208748; the methyl methacrylate/methyl acrylate/methacrylic acid copolymer disclosed in JP-A-60-214354 corresponding to U.S. Pat. No. 4,692,396; the benzyl methacrylate/methyl methacrylate/methacrylic acid/2-ethylhexyl acrylate copolymer disclosed in JP-A-5-36581; the methyl methacrylate/n-butyl methacrylate/2-ethylhexyl acrylate/methacrylic acid copolymer disclosed in JP-A-5-333542; the styrene/methyl methacrylate/methyl acrylate/methacrylic acid copolymer disclosed in JP-A-7-261407; the methyl methacrylate/n-butyl methacrylate/2-ethylhexyl acrylate/methacrylic acid copolymer disclosed in JP-A-10-110008; the methyl methacrylate/n-butyl acrylate/2-ethylhexyl acrylate/styrene/methacrylic acid copolymer disclosed in JP-A-10-198031, etc.

In the present invention, a resin having an ethylenically unsaturated group on side chains which is not alkali soluble can be also used by mixing. The example of the resin having an ethylenically unsaturated group on side chains which is not alkali soluble includes a resin obtained by reacting all carboxylic acids of the alkali soluble resin having carboxylic acids with the epoxy group of the ethylenically unsaturated compound containing an epoxy group (e.g. glycidyl (meth)acrylate, 3,4-epoxycyclohexylmethyl (meth)acrylate and the like), a resin obtained by reacting a resin having a hydroxyl group which is not alkali soluble with isocyanate group of an ethylenically unsaturated compound having an isocyanate group, etc. There is no problem specifically even if a resin having an ethylenically unsaturated group on side chains which is not alkali soluble is synthesized according to another method to be used.

There is no problem specifically so far as a mixture of the above-described resin with the alkali soluble resin is alkali soluble as a result, and as a whole, it can be assumed as the alkali soluble resin. The property of the resin, in such case, is assumed as a mixture.

The alkali soluble resin that can be used for the present invention has desirably a resin acid value of 15 to 200 mgKOH/g and preferably 40 to 150 mgKOH/g and has weight average molecular weight of 5000 to 200000, preferably 10000 to 200000. When the resin acid value of the alkali soluble resin is less than 30 mgKOH/g, alkali development property is inadequate. When it is larger than 250 mgKOH/g, the alkali development property is adequate but film thickness is reduced and the image remaining property is deteriorated.

When the weight average molecular weight of the alkali soluble resin is less than 5000, printing durability is deteriorated. Further, when the solid-retaining ability of a product such as a printing plate material is required, the solid-retaining ability is deteriorated. When it exceeds 200000, the alkali development property is lowered.

Ethylenically Unsaturated Compound

The ethylenically unsaturated compound that can be used for the photosensitive resin composition of the present invention is not specifically limited, so far as it is a compound having an ethylenically unsaturated double bond that can be subjected to a radical addition polymerization and cured by action of a photopolymerization initiator.

Specifically, the ethylenically unsaturated compound includes acrylic acid, methacrylic acid, methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, tert-butyl (meth)acrylate, 2-ethylhexyl (meth)acrylate, n-nonyl (meth)acrylate, n-decyl (meth)acrylate, lauryl (meth)acrylate, n-tridecyl (meth)acrylate, stearyl (meth)acrylate, ethylene glycol mono(meth)acrylate, propylene glycol mono(meth)acrylate, diethylene glycol mono(meth)acrylate, dipropylene glycol mono(meth)acrylate, polyethylene glycol mono(meth)acrylate having molecular weight of 200 to 1000, polypropylene glycol mono(meth)acrylate having molecular weight of 200 to 1000, polyethylene glycol monomethyl ether mono(meth)acrylate having molecular weight of 200 to 1000, polypropylene glycol monomethyl ether mono(meth)acrylate having molecular weight of 200 to 1000, polyethylene glycol monoethyl ether mono(meth)acrylate having molecular weight of 200 to 1000, polypropylene glycol monoethyl ether mono(meth)acrylate having molecular weight of 200 to 1000, n-butoxyethyl (meth)acrylate, phenoxyethyl (meth)acrylate, 2-phenoxypropyl (meth)acrylate, cyclohexyl (meth)acrylate, tetrahydrofurfuryl (meth)acrylate, glycidyl (meth)acrylate, allyl (meth)acrylate, benzyl (meth)acrylate, tribromophenyl (meth)acrylate, 2,3-dichloropropyl (meth)acrylate, 3-chloro-2-hydroxypropyl(meth)acrylate, N,N-diethyl aminoethyl (meth)acrylate, N,N-dimethylaminoethyl (meth)acrylate, N-t-butylaminoethyl (meth)acrylate, ethylene glycol di(meth)acrylate, propylene glycol di(meth)acrylate, 1,3-propanediol di(meth)acrylate, 1,4-butanediol di(meth)acrylate, neopentyl glycol di(meth)acrylate, 1,6-hexanediol di(meth)acrylate, polyethylene glycol di(meth)acrylate, polypropylene glycol di(meth)acrylate, glycerin di(meth)acrylate, glycerin tri(meth)acrylate, trimethylolpropane tri(meth)acrylate, trimethylolethane tri(meth)acrylate; acrylamide, ethylene bis(acrylamide), ethylene bis(methacrylamide), hexamethylene bis(acrylamide), hexamethylene bis(methacrylamide), etc.

Further, there can be also preferably used polyurethane (meth)acrylates obtained by reacting polyester polyol (for example, polyester polyols obtained by reacting diol component such as ethylene glycol, diethylene glycol and 1,3-butylene glycol with acid component such as dibasic acid, such as phthalic acid, tetrahydrophthalic acid and hexahydrophthalic acid, or anhydride thereof) with polyisocyanate (for example, tolylene diisocyanate, 4,4'-diphenylmethanediisocyanate, isophorone diisocyanate and hexamethylene diisocyanate etc.) and (meth)acrylate containing a hydroxyl group (for example, 2-hydroxyethyl (meth)acrylate, 2-hydroxypropyl (meth)acrylate, glycerin di(meth)acrylate, pentaerythrytol tri(meth)acrylate and dipentaerythrytol penta(meth)acrylate, etc.); polyurethane (meth)acrylates obtained by reacting the compound having 3 or more of isocyanate groups in the molecule that is disclosed in JP-A-10-90886 (for example, isocyanurates, burets and adducts of diisocyanates) with (meth)acrylate containing a hydroxyl group (for example, 2-hydroxypropyl (meth)acrylate, 2-hydroxypropyl (meth)acrylate, glycerin di(meth)acrylate, pentaerythrytol tri(meth)acrylate, dipentaerythrytol penta(meth)acrylate and the like); bisphenol type epoxy acrylates obtained by reacting a bisphenol type epoxy resin (for example, EPIKOTE 828, EPIKOTE 1001, EPIKOTE 1004 and EPIKOTE 807 and the like by Shell) with (meth)acrylic acid; novolac type epoxyacrylates obtained by reacting a novolac type epoxy resin (for example, EPIKOTE 152 and EPIKOTE 154 by Shell) with (meth)acrylic acid, etc.

The ethylenically unsaturated compound that can be used for the photosensitive resin composition of the present invention may be the fore-mentioned compound, but it has desirably 2 or more, preferably 3 to 15, more preferably 4 to 15 of (meth)acrylic groups, and has desirably molecular weight of 300 to 3000, preferably 500 to 3000. When the number of the (meth)acrylic groups of the ethylenically unsaturated compound is less than 2, printing durability is lowered. When the molecular weight of the ethylenically unsaturated compound is less than 300, crosslinking density is heightened but impact resistance is weakened, printing durability is all the more lowered. When it exceeds 3000, crosslinking density is lowered and printing durability is lowered.

The content of the ethylenically unsaturated compound is desirably 30 to 90% by weight, preferably 40 to 80% by weight based on the total weight of the photosensitive resin composition. When the content of the ethylenically unsaturated compound is less than 30% by weight, sensitivity is lowered and printing durability is lowered. When it exceeds 90% by weight, solid-retaining ability is deteriorated in the case the solid-retaining ability of product such as printing plate material is required.

Near Infrared Absorbing Dye

The near infrared absorbing dye that can be used for the photosensitive resin composition of the present invention is a compound having absorption at wavelength area of 600 to 1100 nm and specifically, includes naphthoquinone dyes, anthraquinone dyes, phthalocyanine dyes, cyanine dyes, polymethine dyes and the like, but is not specifically limited so far as it is known to those skilled in the art as sensitizing dyes. Among these, cyanine dyes and polymethine dyes are preferable, particularly, dyes having the maximum absorption wavelength of 800 to 860 nm are preferable. The dye may be one, or a combination of 2 or more.

Specifically, these exemplified below are mentioned, but are not limited to these.

They include quinoline cyanine dyes, for example, 1-ethyl-4-[5-(1-ethyl-4(1H)-quinolinilidene)-1,3-pentadienyl] quinolinium iodide (maximum absorption wavelength=814 nm: MeOH) represented by the formula:

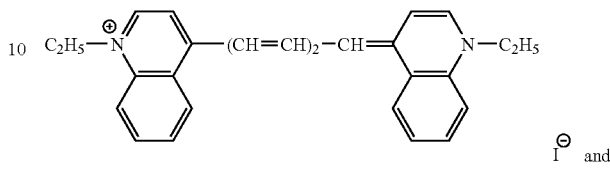

1-ethyl-2-[7-(1-ethyl-2(1H)-quinolinilidene)-1,3,5-heptatrienyl]quinolinium iodide (maximum absorption wavelength=817 nm: MeOH) represented by the formula:

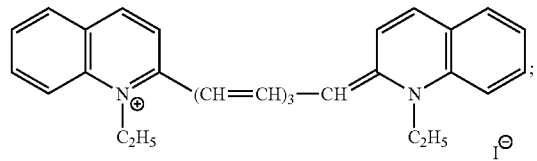

benzopyrylium cyanine dyes, for example, 8-[(6,7-dihydro-2,4-diphenyl-5H-1-benzopyran-8-yl)methylene]-5,6,7,8-tetrahydro-2,4-diphenyl-1-benzopyrylium perchlorate (maximum absorption wavelength=840 nm: dichloroethane) represented by the formula:

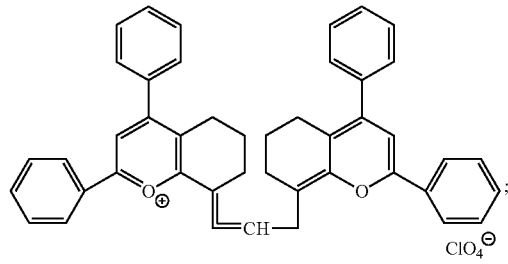

benzothiazole cyanine dyes, for example, 5-chloro-2-[2-[3-[2-(5-chloro-3-ethyl-2(3H)-benzothiazolilidene)ethylidene]-2-diphenylamino-1-cyclopenten-1-yl]ethenyl]-3-ethylbenzothiazolium perchlorate (maximum absorption wavelength=825 nm: DMSO) represented by the formula:

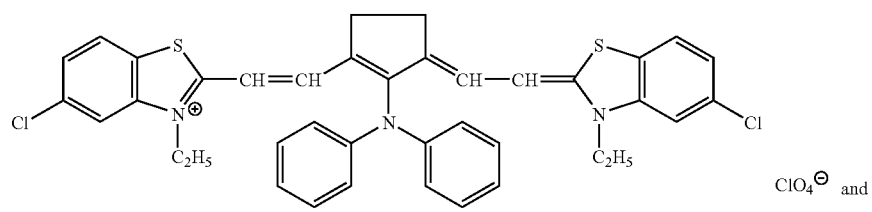

3-ethyl-2-[2-[3-[2-(3-ethyl-2(3H)-benzothiazolilidene)ethylidene]-2-diphenylamino-1-cyclopenten-1-yl]ethenyl]benzothiazolium perchlorate (maximum absorption wavelength=831 nm: DMSO) represented by the formula:

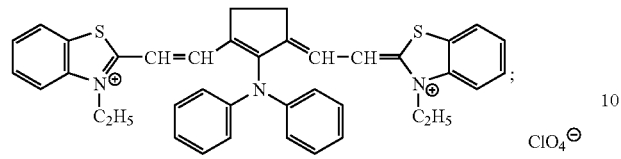

indole cyanine dyes, for example, 2-[2-[2-chloro-3-[(3-ethyl-1,3-dihydro-1,1-dimethyl-2H-benz[e]indol-2-ylidene)ethylidene]-1-cyclohexen-1-yl]ethenyl]-1,1-dimethyl-3-ethyl-1H-benz[e]indolium tetrafluoroborate (maximum absorption wavelength=816 nm: MeOH) represented by the formula:

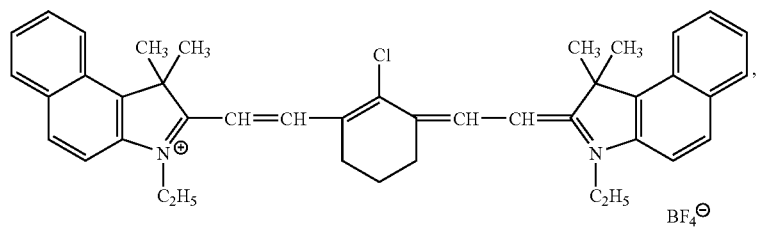

3-butyl-1,1-dimethyl-2-[2-[2-diphenylamino-3-[(3-butyl-1,3-dihydro-1,1-dimethyl-2H-benz[e]indol-2-ylidene)ethylidene]-1-cyclopenten-1-yl]ethenyl]-1H-benz[e]indolium perchlorate (maximum absorption wavelength=830 nm: MeOH) represented by the formula:

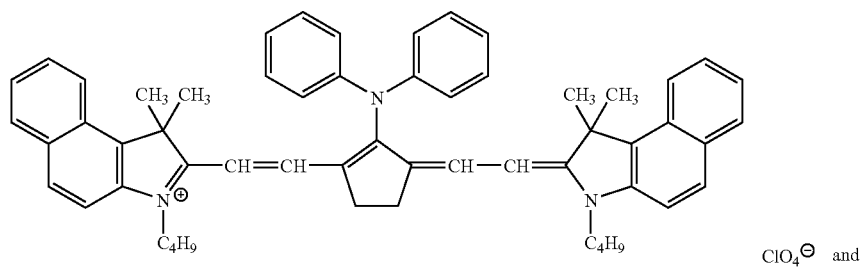

2-[2-[2-chloro-3-[(3-ethyl-1,3-dihydro-1,1-dimethyl-2H-benz[e]indol-2-ylidene)ethylidene]-1-cyclopenten-1-yl]ethenyl]-1,1-dimethyl-3-ethyl-1H-benz[e]indolium iodide (maximum absorption wavelength=841 nm: MeOH) represented by the formula:

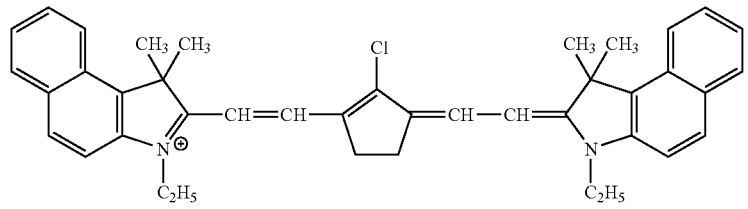

polymethylene dyes, for example, 1,1,5,5-tetrakis[4-(diethylamino)phenyl]-1,4-pentadien-3-ylium p-toluene sulfonate (maximum absorption wavelength=817 nm: ACCN acetonitrile) represented by the formula:

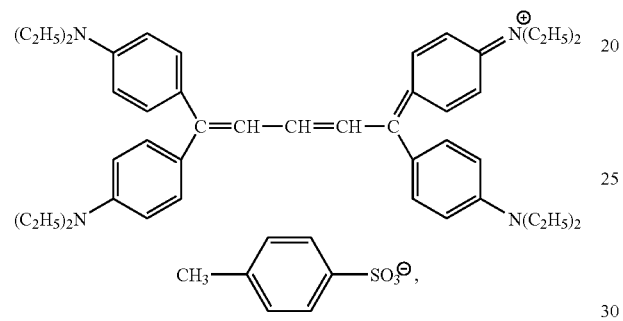

1,5-bis[4-(diethylamino)phenyl]-1,5-bis(4-methoxyphenyl)-1,4-pentadien-3-ylium trifluoromethane sulfonate (maximum absorption wavelength=819 nm: AcCN) represented by the formula:

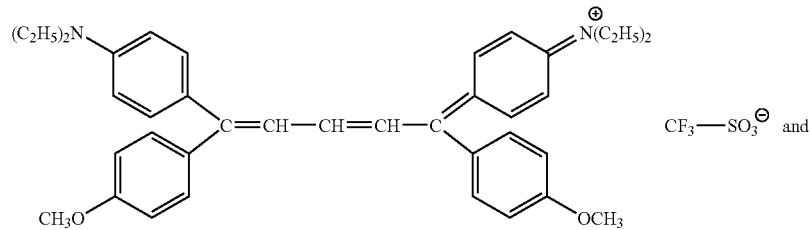

1,1,5,5-tetrakis[4-(diethylamino)phenyl]-1,4-pentadien-3-ylium butyl(triphenyl) borate (maximum absorption wavelength=820 nm: ACCN) represented by the formula:

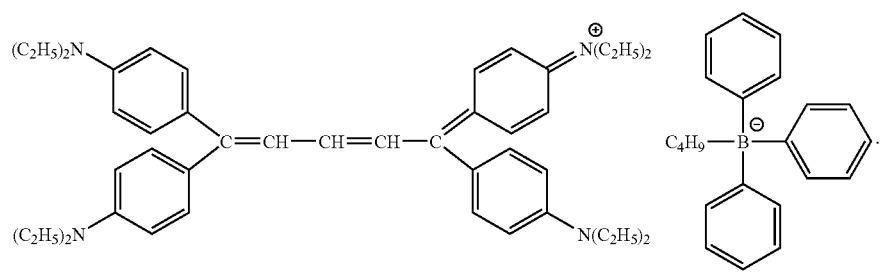

In the photosensitive resin composition of the present invention, the content of the near infrared absorbing dye is 0.05 to 20 parts by weight, preferably 0.5 to 10 parts by weight based on 100 parts by weight of the total amount of the ethylenically unsaturated compound and the alkali soluble resin. When the content of the near infrared absorbing dye is lower than 0.05 part by weight, curing is inadequate. When it exceeds 20 parts by weight, the curing of an underlayer portion is difficult.

Compound Containing Halomethyl Group

The compound containing a halomethyl group that can be used in the photosensitive resin composition of the present invention includes an S-triazine compound having at least one methyl group in which at least one hydrogen atom has been substituted with a chlorine atom or a bromine atom, preferably an S-triazine compound, in which at least one trichloromethyl group has been attached to the carbon atom of S-triazine skeleton, that is represented by the formula:

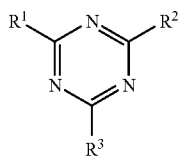

wherein $R^1$, $R^2$ and $R^3$ are each independently a trichloromethyl group, an alkyl group which may have 1 to 10 carbon atoms and preferably 1 to 4 substituents, an aryl group having 6 to 15 carbon atoms, preferably 6 to 10 carbon atoms, an aralkyl group having 7 to 25 carbon atoms, preferably 7 to 14 carbon atoms, an alkoxy group having 1 to 10 carbon atoms, preferably 1 to 4 carbon atoms, an alkenyl group having 2 to 15 carbon atoms, preferably 2 to 10 carbon atoms, a piperidino group, a piperonyl group, an amino group, a dialkyl amino group having 2 to 20 carbon atoms, preferably 2 to 8 carbon atoms, a thiol group or an alkylthio group having 1 to 10 carbon atoms, preferably 1 to 4 carbon atoms, with the proviso that at least one of $R^1$ to $R^3$ is a trichloromethyl group; and a compound having a tribromomethylsulfonyl group, for example, tribromomethylphenylsulfone, 2-tribromomethylsulfonylpyridine, 2-tribromomethylsulfonylbenzthiazole, and the like.

The S-triazine compound that can be preferably used, in particular, in the present invention includes specifically 2,4,6-tris(trichloromethyl)-S-triazine, 2-methyl-4,6-bis(trichloromethyl)-S-triazine, 2-methoxy-4,6-bis(trichloromethyl)-S-triazine, 2-phenyl-4,6-bis(trichloromethyl)-S-triazine, 2-(p-methoxyphenyl)-4,6-bis(trichloromethyl)-S-triazine, 2-(4-methylthiophenyl)-4,6-bis(trichloromethyl)-S-triazine, 2-(p-chlorophenyl)-4,6-bis(trichloromethyl)-S-triazine, 2-(4-methoxynaphthyl)-4,6-bis(trichloromethyl)-S-triazine, 2-piperonyl-4,6-bis(trichloromethyl)-S-triazine, 2-piperidino-4,6-bis(trichloromethyl)-S-triazine, 2-styryl-4,6-bis(trichloromethyl)-S-triazine, 2-(p-methoxystyryl)-4,6-bis(trichloromethyl)-S-triazine, 2-(3,4-dimethoxystyryl)-4,6-bis(trichloromethyl)-S-triazine, and 2-(p-dimethylaminostyryl)-4,6-bis(trichloromethyl)-S-triazine.

In the photosensitive resin composition of the present invention, the content of the compound containing a halomethyl group is 0.1 to 20 parts by weight, preferably 1 to 10 parts by weight based on 100 parts by weight of the total amount of the ethylenically unsaturated compound and the alkali soluble resin. When the content of the compound containing a halomethyl group is lower than 0.1 part by weight, curing is inadequate. When it exceeds 20 parts by weight, the solvent resistance of cured article and the like are lowered.

Compound Containing Organoboron Anion

The compound containing an organoboron anion that can be used for the photosensitive resin composition of the present invention is required to be represented by the formula (a):

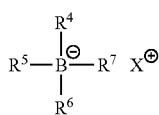

wherein $R^4$, $R^5$, $R^6$ and $R^7$ are each independently an alkyl group having 1 to 10 carbon atoms, an aryl group having 6 to 15 carbon atoms, an alkaryl group having 2 to 10 carbon atoms, an allyl group, an aralkyl group having 1 to 10 carbon atoms, an alkenyl group having 1 to 10 carbon atoms or an alkynyl group having 1 to 10 carbon atoms, each group may have a substituent, $X^+$ is counter cation, alkali metal cation (for example, sodium cation and lithium cation) or phosphonium cation.

It is desirable to be selected from compound represented by the formula (b):

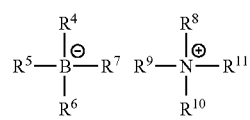

wherein $R^8$, $R^9$, $R^{10}$ and $R^{11}$ are each independently an alkyl group having 1 to 10 carbon atoms, an aryl group having 6 to 15 carbon atoms, an alkaryl group having 2 to 10 carbon atoms, an allyl group, an aralkyl group having 1 to 10 carbon atoms, an alkenyl group having 1 to 10 carbon atoms, an alkynyl group having 1 to 10 carbon atoms, a silyl group, a alicyclic group or a heterocyclic group, each group may have a substituent and may have a ring structure, $R^4$, $R^5$, $R^6$ and $R^7$ are each independently an alkyl group having 1 to 10 carbon atoms, an aryl group having 6 to 15 carbon atoms, an alkaryl group having 2 to 10 carbon atoms, an allyl group, an aralkyl group having 1 to 10 carbon atoms, an alkenyl group having 1 to 10 carbon atoms or an alkynyl group having 1 to 10 carbon atoms and each group may have a substituent with the proviso that at least one of $R^4$, $R^5$, $R^6$ and $R^7$ is preferably an alkyl group.

For example, the compound containing an organoboron anion represented by the formula (a), wherein $X^-$ is alkali metal cation or phosphonium cation, includes sodium tetraphenylborate, lithium triphenyl-n-butyl borate, tetraphenylphosphonium tetrakis(4-methylphenyl)borate, tetraphenylphosphonium tetraphenylborate, benzyltriphenylphosphonium tetraphenylborate, 4-methylphenyltriphenylphosphonium tetrakis(4-methylphenyl)borate, etc.

The example of the compound containing an organoboron anion represented by the formula (b) includes tetramethylammonium tetraphenylborate, tetraethylammonium tetraphenylborate, tetramethylammonium tetraanisylborate, 1,5-diazabicyclo[4,3,0]nonene-5-tetraphenylborate, 1,8-diazabicyclo[5,4,0]undecene-7-tetraphenylborate, 2-ethyl-4-methylimidazolium tetraphenylborate, tetramethylammonium triphenyl-n-butylborate, tetramethylammonium triphenyl-n-octylborate, tetraethylammonium triphenyl-n-butylborate, tetramethylammonium trianisyl-n-butylborate, tetraethylammonium diphenyldi-n-butylborate, etc.

In the photosensitive resin composition of the present invention, the content of the compound containing an organoboron anion is 0.1 to 20 parts by weight, preferably 1 to 10 parts by weight based on 100 parts by weight of the total amount of the ethylenically unsaturated compound and the alkali soluble resin. When the content of the compound containing an organoboron anion is lower than 0.1 part by weight, curing is inadequate. When it exceeds 20 parts by weight, the solvent resistance of cured article and the like are lowered.

In the photosensitive resin composition of the present invention, the weight ratio of the near infrared absorbing dye, the compound containing an organoboron anion and the compound containing a halomethyl group is desirably 0.1 to 10, preferably 0.2 to 5 for the compound containing an organoboron anion as well as 0.1 to 10, preferably 0.2 to 5 for the compound containing a halomethyl group when the weight of the near infrared absorbing dye is referred to as 1.

Nitroxyl Compound

The photosensitive resin composition of the present invention may further contain a nitroxyl compound as an additional component. The nitroxyl compound significantly improves storage stability of the photosensitive resin composition of the present invention, in particular, storage stability of a printing plate material for CTP (computer to plate) having photosensitivity at 830 nm.

The nitroxyl compound is specifically disclosed in JP-A-10-97059 corresponding to EP 0828195B and more specifically, includes di-tert-butylnitroxyl, 1-oxyl-2,2,6,6-tetramethylpiperidine, 1-oxyl-2,2,6,6-tetramethylpiperidin-4-ol, 1-oxyl-2,2,6,6-tetramethylpiperidin-4-on, 1-oxyl-2,2,6,6-tetramethylpiperidin-4-yl acetate, 1-oxyl-2,2,6,6-tetramethylpiperidin-4-yl-2-ethyl hexanoate, 1-oxyl-2,2,6,6-tetramethylpiperidin-4-yl stearate, 1-oxyl-2,2,6,6-tetramethylpiperidin-4-yl benzoate, 1-oxyl-2,2,6,6-tetramethylpiperidin-4-yl 4-tert-butyl benzoate, bis(1-oxyl-2,2,6,6-tetramethylpiperidin-4-yl)succinate, bis(1-oxyl-2,2,6,6-tetramethylpiperidin-4-yl)adipate, bis(1-oxyl-2,2,6,6-tetramethylpiperidin-4-yl)sebacate, bis(1-oxyl-2,2,6,6-tetramethylpiperidin-4-yl)n-butyl malonate, bis(1-oxyl-2,2,6,6-tetramethylpiperidin-4-yl)phthalate, bis(1-oxyl-2,2,6,6-tetramethylpiperidin-4-yl)isophthalate, bis(1-oxyl-2,2,6,6-tetramethylpiperidin-4-yl)terephthalate, bis(1-oxyl-2,2,6,6-tetramethylpiperidin-4-yl)hexahydroterephthalate, N,N'-bis(1-oxyl-2,2,6,6-tetramethylpiperidin-4-yl)adipamide, N-(1-oxyl-2,2,6,6-tetramethylpiperidin-4-yl)caprolactam, N-(1-oxyl-2,2,6,6-tetramethylpiperidin-4-yl)dodecylsuccinimide, 2,4,6-tris (1-oxyl-2,2,6,6-tetramethylpiperidin-4-yl)isocyanurate, 2,4,6-tris[N-butyl-N-(1-oxyl-2,2,6,6-tetramethylpiperidin-4-yl)]s-triazine and 4,4'-ethylenebis(1-oxyl-2,2,6,6-tetramethylpiperadin-3-on). Bis(1-oxyl-2,2,6,6-tetramethylpiperidin-4-yl)sebacate is most preferable.

The content of the nitroxyl compound in the composition is 0.1 to 1 part by weight, preferably 0.1 to 0.5 part by weight, more preferably 0.1 to 0.3 part by weight based on 100 parts by weight of the total amount of the ethylenically unsaturated compound and the alkali soluble resin. When the content is lower than 0.1 part by weight, the effect of storage stability is not expressed. When it is more than 1 part by weight, the curing of the photosensitive layer is difficult.

Other Additives

The photosensitive resin composition according to the present invention may desirably contain an organic pigment and/or an organic solvent soluble dye as a coloring agent, which can visually indicate whether image is appropriately formed on a printing plate material formed by the composition, i.e., which can improve visibility of the material, so that the material is conveniently handled. The photosensitive resin composition of the present invention is colored in any color, preferably in red or blue, but which is not limited. The organic pigment and dye include azo pigments, phthalocyanine pigments, azo dyes, etc. Use of the organic pigment in the photosensitive resin composition can remove stickiness of the resulting photosensitive layer, while it improves visibility.

The content of the coloring agent contained in the photosensitive resin composition of the present invention is 1 to 50 parts by weight, preferably 5 to 45 parts by weight based on 100 parts by weight of the total amount of the ethylenically unsaturated compound and the alkali-soluble resin. When the content is more than 50 parts by weight, it is difficult to cure the photosensitive layer formed by the composition. When the content is less than 1 part by weight, it provides insufficient visibility.

Further other additives may be incorporated in the photosensitive resin composition of the present invention, such as solvents, matting agents, loading agents, heat-polymerization inhibitors, plasticizers, surfactants to improve coating properties, anti-foam agent and inorganic or organic fine particle fillers. Preferable inorganic fillers include silica fine powder (particle size: 0.001 to 2 μm) and colloidal silica dispersed in solvents (particle size: 0.001 to 1 μm). Preferable organic fillers include microgel which core is gel (particle size: 0.01 to 5 μm). For example, such particularly preferable microgel is disclosed in JP-A-4-274428 corresponding to U.S. Pat. No. 5,393,637, wherein microgel having particle size of 0.01 to 2 μm is prepared by emulsion polymerization by using a polymer emulsifier having Sp value of 9 to 16.

The photosensitive resin composition of the present invention can be prepared in accordance with the conventional methods, for example, which include mechanically stirring and mixing the above components under shading with an apparatus known to those skilled in the art, such as high speed stirrers.

Preparation of Printing Plate

The photosensitive resin composition according to the present invention, which can be subjected to alkaline development, can provide a printing plate. The printing plate can be prepared in accordance with a conventional method, for example, which includes first step of applying the present photosensitive resin composition, which can be subjected to alkaline development, on an appropriate substrate. The substrate includes, for example, plates of metal such as aluminum (including aluminum alloy), zinc and copper as well as materials wherein the above listed metal is laminated or deposited on a plastic film such as cellulose diacetate, cellulose triacetate, cellulose propionate, cellulose acetate, methylcellulose acetate, ethylcellulose acetate, cellulose nitrate, polyethylene terephthalate, polyethylene, polystyrene, polypropylene, polycarbonate, polyvinyl acetal, etc. Among others, aluminum plate is particularly preferable as a substrate, since aluminum plate is significantly stable in its size and has considerably light weight and low price. Laminated sheet wherein an aluminum sheet is attached on the polyethylene terephthalate film, which is disclosed in JP-B-48-18327, is also preferable. In the case that substrate having metallic surface, particularly aluminum surface, is used, it is desirable that the surface is hydrophilically treated in accordance with the known methods.

For example, the applying manner includes coating by a bar coater, but is not particularly limited. Subsequently, the coated substrate is dried, for example, at 60 to 100° C. for 1 to 10 minutes. It is preferable that the coated amount after drying is about 0.5 to 2.5 g/m$^2$. Appropriately, a protective layer may be formed by further applying a resin soluble in an alkaline developing solution, such as polyvinyl alcohol, hydroxypropyl methylcellulose, or the like, and then drying.

A laser exposing apparatus that emits near infrared light to infrared light is used for exposure when an image is formed on the printing plate of the present invention. A preferable irradiation wavelength is ranging from 780 to 1200 nm. Recently, the laser exposing apparatus includes solid laser such as semiconductor laser and YAG. Drawing is carried out by scanning laser for exposure in an image mode based on the digital information of a computer and by curing the exposed portion. In particular, exposure by infrared laser having wavelength of 780 to 880 nm is advantageous.

Developing includes contact with a soluble liquid which can solubilize the unexposed portion. As the liquid, same organic solvent as used in the preparation of the photosensitive liquid can be also used, but an aqueous alkali solution is preferable. For example, the aqueous alkali solution includes an aqueous alkali solution with about 0.1 to 10% by weight of inorganic alkali such as sodium hydroxide, potassium hydroxide, sodium carbonate, sodium bicarbonate, potassium carbonate, potassium bicarbonate, sodium phosphate, potassium phosphate, sodium silicate, potassium silicate, lithium silicate, ammonium silicate, sodium metasilicate and potassium metasilicate; and/or organic alkali such as triethanol amine, diethanol amine, monoethanol amine, trimethanol amine, dimethanol amine, monomethanol amine, tetramethylammonium hydroxide, tetraethylammonium hydroxide and pyridine, etc. A small amount of additives such as a surfactant, an organic solvent and an anti-foam agent can be added to the aqueous alkali solution in order to improve performance such as developing property. Since the addition of a surfactant often provides preferable results in improvement of image resolution, prevention for scumming and the like, the addition of surfactant is preferable. The surfactant includes known nonion, anion, cation and betaine surfactants. The developing method is not specifically limited and various methods such as spin development, paddle development, dip development and spray development can be used.

Treatments such as post-baking and post-exposure can be applied after development if necessary. When such post-treatment is applied, crosslinking density and adhesion are improved, and printing durability and etching resistance can be improved.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

EXAMPLES

The present invention is further specifically described according to Examples. The present invention shall not be construed to be limited to these Examples.

Synthetic Examples of Resins

Synthesis of Acryl Resin A

Into a 4 litter flask, 1260 g of diethylene glycol dimethyl ether (DMDG) was charged and temperature was raised to 110° C. with stirring. A mixture of 285 g of styrene (ST), 582 g of methyl methacrylate (MMA), 276 g of methacrylic acid (MAA) and 56 g of 2-hydroxyethyl methacrylate (HEMA) which were accurately weighed preliminarily and a mixture in which 6 g of initiator Kaya-ester O was dissolved in 360 g of DMDG were added dropwise therein, via separate routes respectively, over 3 hours. After 30 minutes after completion of the dropwise addition, a mixture in which 1 g of initiator Kaya-ester O was dissolved in 180 g of DMDG was further added dropwise over 30 minutes therein, temperature was raised to 120° C. after completion of the dropwise addition and the mixture was cooled after keeping the temperature for 2 hours to synthesize acryl resin A.

Acid value (resin acid value) calculated from the content was 150 mgKOH/g and hydroxyl group value (resin hydroxyl group value) calculated from the content was 20 mgKOH/g.

With respect to the resin properties of the acryl resin A, non volatile content was 40.4%, foam viscosity was Z4 to Z5 and the acid value of varnish resin was 59 mgKOH/g.

Synthesis of Half-Blocked Isocyanate B

Into a 3 litter flask, 2 mol (444 g) of isophorone diisocyanate (IPDI) and 371 g of methyl isobutyl ketone (MIBK) were charged and temperature was raised to 80° C. with stirring. A mixture in which 1 mol (150 g) of triethylene glycol (TEG) and 0.7 g of dibutyltin dilaurate (DBTL) which were accurately weighed preliminarily were dissolved in 148 g of MIBK was added dropwise therein over 1 hour. After the dropwise addition, the mixture was kept at the temperature for 1 hour, and then, a mixture in which 1 mol (519 g) of pentaerythrytol triacrylate (A-TMM-3L (n=3) manufactured by Shin-Nakamura Chemical Co., Ltd.) and 2.2 g of 4-methoxyphenol (MEHQ) that were accurately weighed preliminarily were dissolved in 222 g of MIBK was added dropwise over 1 hour therein. The absorption peak of an isocyanate group at 2270 cm$^{-1}$ was traced on with an infrared spectrophotometer from after 1 hour after completion of the dropwise addition. After the absorption intensity was constant, the reaction was terminated to synthesize half-blocked isocyanate B.

Synthesis of Half-Blocked Isocyanate C

Into a 3 litter flask, 2 mol (444 g) of isophorone diisocyanate (IPDI) and 488 g of methyl isobutyl ketone (MIBK) were charged and temperature was raised to 80° C. with stirring. A mixture in which 1 mol (500 g) of polycarbonate diol PCDX-02 (manufactured by Asahi Kasei Chemical Corporation) and 0.9 g of dibutyltin dilaurate (DBTL) that were accurately weighed preliminarily were dissolved in 195 g of MIBK was added dropwise therein over 1 hour. After the dropwise addition, the mixture was kept at the temperature for 1 hour, and then, a mixture in which 1 mol (519 g) of pentaerythrytol triacrylate (A-TMM-3L (n=3) manufactured by Shin-Nakamura Chemical Co., Ltd.) and 2.9 g of 4-methoxyphenol (MEHQ) that were accurately weighed preliminarily were dissolved in 292 g of MIBK was added dropwise over 1 hour therein. The absorption peak of an isocyanate group at 2270 cm$^{-1}$ was traced on with an infrared spectrophotometer from after 1 hour after completion of the dropwise addition. After the absorption intensity was constant, the reaction was terminated to synthesize half-blocked isocyanate C.

Synthesis of Condensation Diol D of Tetrahydrophthalic Anhydride and 1,6-Hexanediol Into a 3 litter flask, 456 g of tetrahydrophthalic anhydride (THPA), 473 g of 1,6-hexanediol (1,6HD) and 1.7 g of dibutyltin oxide were charged, temperature was raised to 150° C. with stirring, and the temperature was kept for 1 hour. Subsequently, temperature was raised to 220° C. over 3 hours to let dehydration reaction proceed and the reaction was carried out until the acid value of resin solid content was 3.8 mgKOH/g or less. After completion of the reaction, the mixture was cooled to 90° C. and 192 g of MIBK that was accurately weighed preliminarily was gradually charged therein to dilute the mixture. With respect to the resin properties of the finished varnish of condensation diol D, non volatile content was 80.2%, viscosity was G to H' and the acid value of resin solid content was 1.6 mgKOH/g.

Synthesis of Half-Blocked Isocyanate E

Into a 3 litter flask, 2 mol (444 g) of isophorone diisocyanate (IPDI) and 613 g of methyl isobutyl ketone (MIBK) were charged and temperature was raised to 80° C. with stirring. A mixture in which 1 mol (1096 g) of the condensation diol D that was produced above was dissolved in 245 g of MIBK was added dropwise therein over 1 hour. After the dropwise addition, the mixture was kept at the temperature for 1 hour, and then, a mixture in which 1 mol (519 g) of pentaerythrytol triacrylate (A-TMM-3L manufactured by Shin-Nakamura Chemical Co., Ltd.) and 2.5 g of 4-methoxyphenol (MEHQ) that were accurately weighed preliminarily were dissolved in 368 g of MIBK was added dropwise over 1 hour therein. The absorption peak of an isocyanate group at 2270 cm$^{-1}$ was traced on with an infrared spectrophotometer from after 1 hour after completion of the dropwise addition. After the absorption intensity was constant, the reaction was terminated to synthesize half-blocked isocyanate E.

Synthesis of Half-Blocked Isocyanate F

Into a 2 litter flask, 2 mol (444 g) of isophorone diisocyanate (IPDI) and 269 g of methyl isobutyl ketone (MIBK) were charged and temperature was raised to 80° C. with stirring. A mixture in which 1 mol (150 g) of triethylene glycol (TEG) and 0.5 g of dibutyltin dilaurate (DBTL) that were accurately weighed preliminarily were dissolved in 108 g of MIBK was added dropwise therein over 1 hour. After the dropwise addition, the mixture was kept at the temperature for 1 hour, and then, a mixture in which 1 mol (214 g) of 2-hydroxy-3-acryloyloxypropyl methacrylate (LIGHT ESTER G-201P manufactured by KYOEISHA Chemical Co., Ltd.) and 1.6 g of 4-methoxyphenol (MEHQ) that were accurately weighed preliminarily were dissolved in 162 g of MIBK was added dropwise over 1 hour therein. The absorption peak of an isocyanate group at 2270 cm$^{-1}$ was traced on with an infrared spectrophotometer from after 1 hour after completion of the dropwise addition. After the absorption intensity was constant, the reaction was terminated to synthesize half-blocked isocyanate F.

Synthesis of Resin I

Into a 4 litter flask, 2000 g of the acryl resin A, 704 g of solvent DMDG, 0.8 g of catalyst DBTL and 2.3 g of polymerization inhibitor MEHQ were charged and temperature was raised to 80° C. with stirring. 585 g of the half-blocked isocyanate B that was accurately weighed preliminarily was gradually added dropwise therein over 1 hour. The absorption peak of an isocyanate group at 2270 cm$^{-1}$ was traced on with an infrared spectrophotometer from after 1 hour after completion of the dropwise addition. When the absorption intensity became zero, the reaction was terminated to synthesize the objective resin I. With respect to the resin properties of the resin I, non volatile content was 34.8%, foam viscosity was V''' to W and the acid value of varnish resin was 27.3 mgKOH/g.

Synthesis of Resin II

Into a 4 litter flask, 2000 g of the acryl resin A, 835 g of solvent DMDG, 0.8 g of catalyst DBTL and 2.5 g of polymerization inhibitor MEHQ were charged and temperature was raised to 80° C. with stirring. 769 g of the half-blocked isocyanate C that was accurately weighed preliminarily was gradually added dropwise therein over 1 hour. The absorption peak of an isocyanate group at 2270 cm$^{-1}$ was traced on with an infrared spectrophotometer from after 1 hour after completion of the dropwise addition. When the absorption intensity became zero, the reaction was terminated to synthesize the objective resin II. With respect to the resin properties of the resin II, non volatile content was 34.6%, viscosity was V to W and the acid value of varnish resin was 25.4 mgKOH/g.

Synthesis of Resin III

Into a 5 litter flask, 2000 g of the acryl resin A, 1025 g of solvent DMDG, 0.9 g of catalyst DBTL and 2.8 g of polymerization inhibitor MEHQ were charged and temperature was raised to 80° C. with stirring. 1036 g of the half-blocked isocyanate E that was accurately weighed preliminarily was gradually added dropwise therein over 1 hour. The absorption peak of an isocyanate group at 2270 cm$^{-1}$ was traced on with an infrared spectrophotometer from after 1 hour after completion of the dropwise addition. When the absorption intensity became zero, the reaction was terminated to synthesize the objective resin III. With respect to the resin properties of the resin III, non volatile content was 35.2%, foam viscosity was I and the acid value of varnish resin was 23.4 mgKOH/g.

Synthesis of Resin IV

Into a 10 litter flask, 2000 g of the acryl resin A, 1765 g of solvent DMDG, 1.3 g of catalyst DBTL and 4.1 g of polymerization inhibitor MEHQ were charged and temperature was raised to 80° C. with stirring. 2071 g of the half-blocked isocyanate E that was accurately weighed preliminarily was gradually added dropwise therein over 1 hour. The absorption peak of an isocyanate group at 2270 cm$^{-1}$ was traced on with an infrared spectrophotometer from after 1 hour after completion of the dropwise addition. When the absorption intensity became zero, the reaction was terminated to synthesize the objective resin IV. With respect to the resin properties of the resin IV, non volatile content was 34.9%, foam viscosity was S and the acid value of varnish resin was 15.6 mgKOH/g.

Synthesis of Resin V

Into a 4 litter flask, 2000 g of the acryl resin A, 589 g of solvent DMDG, 0.7 g of catalyst DBTL and 2.1 g of polymerization inhibitor MEHQ were charged and temperature was raised to 80° C. with stirring. 425 g of the half-blocked isocyanate F that was accurately weighed preliminarily was gradually added dropwise therein over 1 hour. The absorption peak of an isocyanate group at 2270 cm$^{-1}$ was traced on with an infrared spectrophotometer from after 1 hour after completion of the dropwise addition. When the absorption intensity became zero, the reaction was terminated to synthesize the objective resin V. With respect to the resin properties of the resin V, non volatile content was 34.7%, foam viscosity was Q to R and the acid value of varnish resin was 31.9 mgKOH/g.

Synthesis of Acryl Resin G

Into a 4 litter flask, 1260 g of diethylene glycol dimethyl ether (DMDG) was charged and temperature was raised to 110° C. with stirring. A mixture of 280 g of styrene (ST), 532 g of methyl methacrylate (MMA), 276 g of methacrylic acid (MAA) and 111 g of 2-hydroxyethyl methacrylate (HEMA) that were accurately weighed preliminarily and a mixture in which 12 g of initiator Kaya-ester O was dissolved in 360 g of DMDG were added dropwise therein, via separate routes respectively, over 3 hours. After 30 minutes after completion of the dropwise addition, a mixture in which 2.5 g of initiator Kaya-ester O was dissolved in 180 g of DMDG was further added dropwise over 30 minutes therein, temperature was raised to 120° C. after completion of the dropwise addition and the mixture was cooled after keeping the temperature for 2 hours to synthesize acryl resin G.

Acid value (resin acid value) calculated from the content was 150 mgKOH/g and hydroxyl group value (resin hydroxyl group value) calculated from the content was 40 mgKOH/g.

With respect to the resin properties of the acryl resin G, non volatile content was 43.4%, foam viscosity was Z2 and the acid value of varnish resin was 61.5 mgKOH/g.

Synthesis of Comparative Resin VI

Into a 3 litter flask, 1507 g of the acryl resin G, 430 g of diethyleneglycol dimethyl ether (DMDG), 0.25 g of tetrabutylammonium bromide and 0.24 g of methoxyphenol were charged and temperature was raised to 100° C. with blowing air and stirring. 114 g of glycidyl methacrylate (GMA) that was accurately weighed preliminarily was added dropwise therein over 1 hour. The acid value of varnish resin was measured from after 3 hours after completion of the dropwise addition. After confirming 23.0, it was cooled to synthesize comparative acryl resin VI.

With respect to the resin properties of the comparative acryl resin VI, non volatile content was 34.8%, foam viscosity was M to N and the acid value of varnish resin was 22.8 mgKOH/g.

The characteristics of the resins and the comparative resin as synthesized above are as follows.

TABLE 1

| Resin | Functional material | Number of functional groups | Number of pendants |
|---|---|---|---|
| I | TEG | 3 | 3 |
| II | PCDX-02 | 3 | 3 |
| III | HO-(THPA-1,6HD)$_3$-1,6HD-OH | 3 | 3 |
| IV | HO-(THPA-1,6HD)$_3$-1,6HD-OH | 3 | 6 |
| V | TEG | 2 | 3 |
| VI | GMA | 1 | 1.12 |

TEG = Triethylene glycol
PCDX = Polycarbonate diol
THPA = Tetrahydrophthalic anhydride
1,6HD = 1,6-hexanediol
GMA = Glycidyl methacrylate Examples and Comparative Example Performance Comparison Between Synthesized Resins The performance evaluation of the above-prepared resins was carried out according to the following formulation and evaluation method. The results are shown in Table 2.

Formulation

Objective resin or Comparative resin/DPHA [1]/near infrared absorbing dye [2]/organoboron salt [3]/triazine [4]/pigment=100/100/5/5/5/10 (the weight ratio of solid content)

(1): dipentaerythrytol hexaacrylate (the number of acryl resins; n=5, the molecular weight of acryl resin=578)
(2): 1,1,5,5-tetrakis[4-(diethylamino)phenyl]-1,4-pentadien-3-ylium-p-toluene sulfonate (absorption wavelength: 817 nm)
(3): tetra-n-butylammonium triphenyl-n-butylborate
(4): 2,4,6-tris(trichloromethyl)-S-triazine Evaluation Method (a): The organic solvent solution containing the above components was coated on an aluminum substrate using a bar coater and dried. Film thickness was about 1 μm.
(b): The aqueous solution of partially saponified polyvinyl acetate (205) was coated thereon using a bar coater and dried. Film thickness was about 1.5 μm.
(c): After drawing exposure was carried out at the intensity of two stages at 4 W and 8 W by the TRENDSETTER (manufactured by CREO Inc.) with 50% screening pattern (the wavelength of laser: 830 nm), the developer (DH-N) (produced by Fuji Photo Film Co., Ltd.) was diluted and filled in a brush type automatic processing machine, development was carried out at 30° C. and it was dried in air after rinsing with water.
(d): The image remaining property was visually evaluated according to the following evaluation.
⊙: Sharp and strong image was formed.
◯: Sharp image was formed.
Δ: Although image was confirmed, the sharp persistence on film was inadequate.
x: Image was not remained nor confirmed at all.
(e): Rubbing resistance is evaluated by a method in which an imaged area is rubbed 100 times under a load of 2 kg by a rubbing tester and the abrasion of the imaged area is visually evaluated according to the following evaluation.
⊙: No abrasion occurred and sharp image remained.
◯: Abrasion hardly occurred and sharp image remained.
Δ: Image was significantly worn.
x: Image was lost by abrasion and not confirmed at all.

TABLE 2

| | Resin | | | | | | | | | | | |
|---|---|---|---|---|---|---|---|---|---|---|---|---|
| | I | | II | | III | | IV | | V | | VI | |
| Exposure intensity | 4W | 8W | 4W | 8W | 4W | 8W | 4W | 8W | 4W | 8W | 4W | 8W |
| Image remaining property | ◯ | ◯ | ◯ | ◯ | ◯ | ◯ | ⊙ | ⊙ | ◯ | ◯ | x | Δ |
| Rubbing resistance | ◯ | ◯ | ◯ | ◯ | ◯ | ◯ | ⊙ | ⊙ | ◯ | ◯ | — | x |

—: not tested

Evaluation Results

It is appreciated that the resins according to the present invention is superior in both of image remaining property and rubbing resistance in comparison with the comparative conventional resin.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising", "having", "including", and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those skilled in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The disclosure of Japanese Patent Application No. 2005-316830 filed Oct. 31, 2005 including specification and claims is incorporated herein by reference in its entirety.

What is claimed is:

1. A photosensitive resin composition comprising an alkali soluble resin, an ethylenically unsaturated compound, a near infrared absorbing dye, a compound containing a halomethyl group and a compound containing an organoboron anion, wherein the alkali soluble resin comprises, at least partially, an acryl resin wherein one or more pendant groups represented by the formula (1) are incorporated in an acryl resin having a resin hydroxyl group value of 5 to 100 mgKOH/g and a resin acid value of 30 to 250 mgKOH/g,

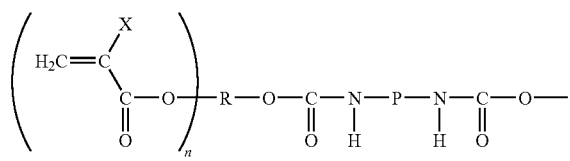

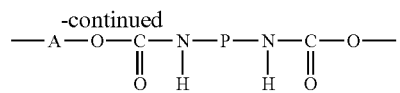

wherein X is the same or different and represents hydrogen or a methyl group, n represents an integer of 2 or 3, R represents an alkylene chain which may have a substituent, P is a group represented by the formula (2):

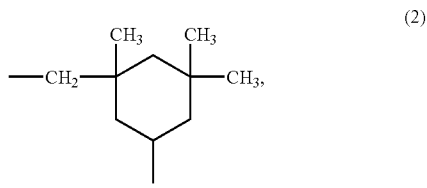

and A represents a diol residue in which OH groups have been removed from a diol compound.

2. The photosensitive resin composition according to claim 1, wherein the ethylenically unsaturated compound has 2 to 15 (meth)acryl groups and a molecular weight of 300 to 3000, and the content of the ethylenically unsaturated compound is 30 to 90% by weight based on the total weight of the photosensitive resin composition.

3. The photosensitive resin composition according to claim 1, wherein the near infrared absorbing dye is a cyanine dye and/or a polymethine dye.

4. The photosensitive resin composition according to claim 3, wherein the near infrared absorbing dye has a maximum absorbing wavelength at 800 to 860 nm.

5. The photosensitive resin composition according to claim 1, wherein the content of the near infrared absorbing dye is 0.05 to 20 parts by weight based on 100 parts by weight of the total amount of the ethylenically unsaturated compound and the alkali soluble resin.

6. The photosensitive resin composition according to claim 1, wherein the content of the compound containing a halomethyl group is 0.1 to 20 parts by weight based on 100 parts by weight of the total amount of the ethylenically unsaturated compound and the alkali soluble resin.

7. The photosensitive resin composition according to claim 1, wherein the content of the compound containing an organoboron anion is 0.1 to 20 parts by weight based on 100 parts by weight of the total amount of the ethylenically unsaturated compound and the alkali soluble resin.

8. The photosensitive resin composition according to claim 1, wherein the weight ratio of the near infrared absorbing dye, the compound containing a halomethyl group and the compound containing an organoboron anion is 0.1 to 10 for the compound containing a halomethyl group and 0.1 to 10 for the compound containing an organoboron anion when the weight of the near infrared absorbing dye is referred to as 1.

9. A printing plate comprising a substrate, and a photosensitive layer formed by the photosensitive resin composition according to claim 1 on the substrate.

10. An image forming method comprising exposing the photosensitive layer of the printing plate according to claim 9 to an infrared laser emitting light having a wavelength of 780 to 1200 nm, and development processing with alkali developer.

11. A printing plate obtainable by the image forming method according to claim 10.

12. The photosensitive resin composition according to claim 1, wherein the pendant group represented by the formula (1) is prepared by blocking both terminals of a diol compound with isophorone diisocyanates and then reacting one isocyanate group of the blocked diol compound with a 2-functional or 3-functional (meth)acryloyl compound.

13. The photosensitive resin composition according to claim 12, wherein the 2-functional or 3-functional (meth) acryloyl compound is pentaerythrytol triacrylate or 2-hydroxy-3-acryloyloxypropyl methacrylate.

* * * * *